United States Patent
Perner

(10) Patent No.: US 6,256,247 B1
(45) Date of Patent: Jul. 3, 2001

(54) DIFFERENTIAL SENSE AMPLIFIERS FOR RESISTIVE CROSS POINT MEMORY CELL ARRAYS

(75) Inventor: Frederick A. Perner, Palo Alto, CA (US)

(73) Assignee: Hewlett-Packard Co, Palo Alto, CA (US)

( * ) Notice: Subject to any disclaimer, the term of this patent is extended or adjusted under 35 U.S.C. 154(b) by 0 days.

(21) Appl. No.: 09/745,103

(22) Filed: Dec. 19, 2000

Related U.S. Application Data

(63) Continuation-in-part of application No. 09/498,587, filed on Feb. 4, 2000, now Pat. No. 6,185,143.

(51) Int. Cl.[7] .................................................. G11C 11/15
(52) U.S. Cl. ..................... 365/209; 365/210; 365/208; 365/207; 365/206; 365/173; 365/171; 365/148; 365/158; 365/190; 365/189.07
(58) Field of Search ........................ 365/205, 206, 365/207, 208, 209, 210, 171, 173, 157, 158, 148, 190, 189.07, 100

(56) References Cited

U.S. PATENT DOCUMENTS

| | | | |
|---|---|---|---|
| 4,633,443 | * | 12/1986 | Childers ................................ 365/203 |
| 5,831,920 | * | 11/1998 | Chen et al. ........................ 365/225.5 |
| 5,898,612 | * | 4/1999 | Chen et al. ............................ 365/158 |
| 5,982,658 | * | 11/1999 | Berg et al. ............................ 365/158 |

FOREIGN PATENT DOCUMENTS

1003176A2   5/2000   (EP) .............................. G11C/11/15

OTHER PUBLICATIONS

English translation of EP1003176A2, May 24, 2000, pp. 1–22.

\* cited by examiner

Primary Examiner—Andrew Q. Tran

(57) ABSTRACT

Resistance of a memory cell element in a resistive cross point memory cell array is sensed by a read circuit including a differential amplifier, a first direct injection preamplifier and a second direct injection preamplifier. During a read operation, the first direct injection preamplifier is coupled to a first input node of the differential amplifier, and the second direct injection preamplifier is coupled to a second input node of the differential amplifier.

22 Claims, 3 Drawing Sheets

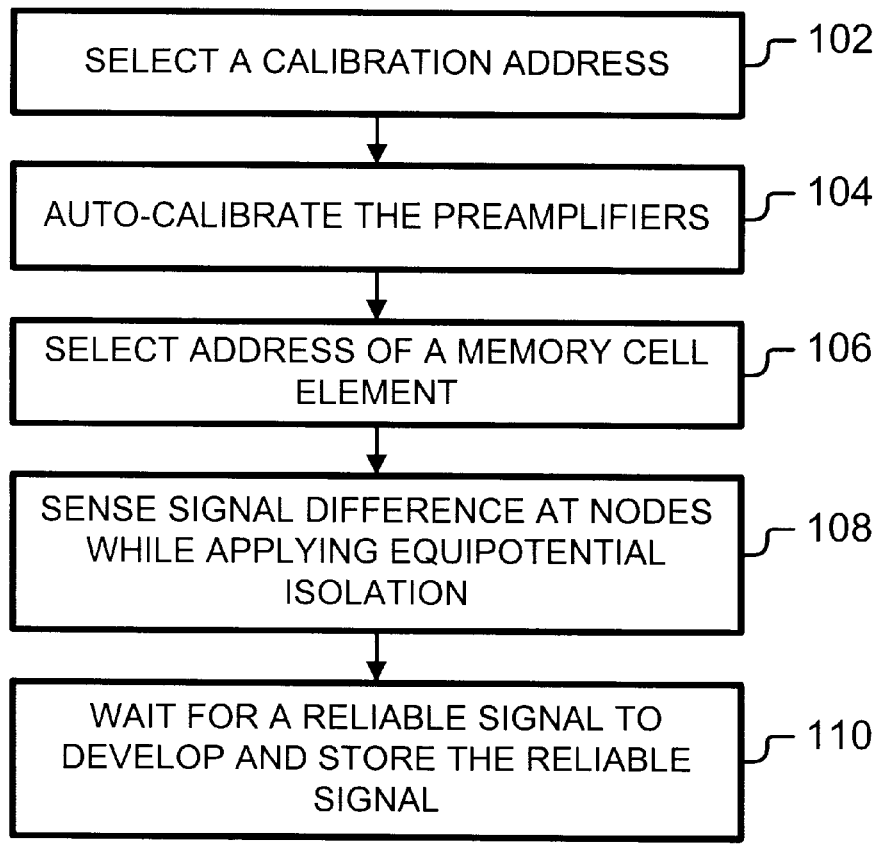
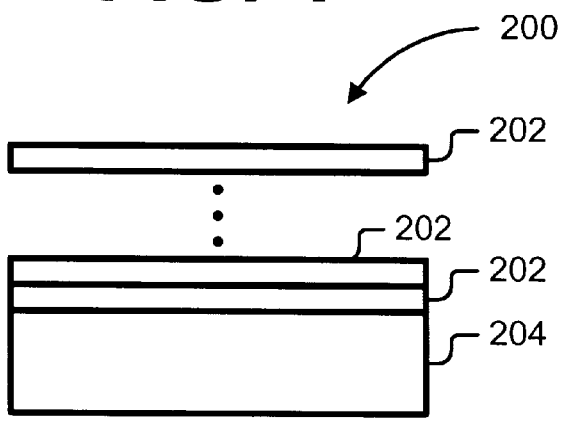

DIFFERENTIAL SENSE AMPLIFIERS FOR RESISTIVE CROSS POINT MEMORY CELL ARRAYS

CROSS-REFERENCE TO RELATED APPLICATION

This is a continuation-in-part of U.S. Ser. No. 09/498,587 filed Feb. 4, 2000, now U.S. Pat. No. 6,185,143. The specification of U.S. Ser. No. 09/498,587 is incorporated herein by reference.

BACKGROUND

The present invention relates to information storage devices. More specifically, the present invention relates to sense amplifiers for resistive cross point memory cell arrays.

Consider the example of a Magnetic Random Access Memory ("MRAM") device including a resistive cross point array of spin dependent tunneling (SDT) junctions, word lines extending along rows of the SDT junctions, and bit lines extending along columns of the SDT junctions. Each SDT junction memory cell element is located at a cross point of a word line and a bit line. The magnetization of each SDT junction assumes one of two stable orientations at any given time. These two stable orientations, parallel and anti-parallel, represent logic values of '0' and '1.' The magnetization orientation, in turn, affects the resistance of the SDT junction. Resistance of the SDT junction is a first value (R) if the magnetization orientation is parallel and a second value (R+ΔR) if the magnetization orientation is anti-parallel. The magnetization orientation of the SDT junction and, therefore, its logic value may be read by sensing its resistance state.

Sensing the resistance state of a single SDT junction in the array can be unreliable. All SDT junctions in the array are coupled together through many parallel paths. The resistance seen at one cross point equals the resistance of the SDT junction at that cross point in parallel with resistances of SDT junctions in the other rows and columns (the array of SDT junctions may be characterized as a cross point resistor network).

Moreover, small differences inherent in sense amplifiers can lead to small differential voltages applied to the resistive cross point array when attempting to sense a single SDT junction. These small differential voltages can give rise to parasitic or "sneak path" currents. The parasitic currents can interfere with the sensing of the resistance states.

There is a need to reliably sense the resistance states of SDT junctions in MRAM devices. More generally, there is a need to reliably sense resistance states of memory cell elements in resistive cross point memory cell arrays.

SUMMARY

According to one aspect of the present invention, a read circuit for a resistive cross point memory cell array includes a differential amplifier having first and second input nodes; a first direct injection preamplifier coupled to the first input node of the differential amplifier; and a second direct injection preamplifier coupled to the second input node of the differential amplifier. Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 3 is a flowchart of a method of sensing a resistance state of a memory cell; and FIG. 4 is an illustration of a chip including multiple levels of resistive cross point memory cell arrays.

DETAILED DESCRIPTION

Figure 1:
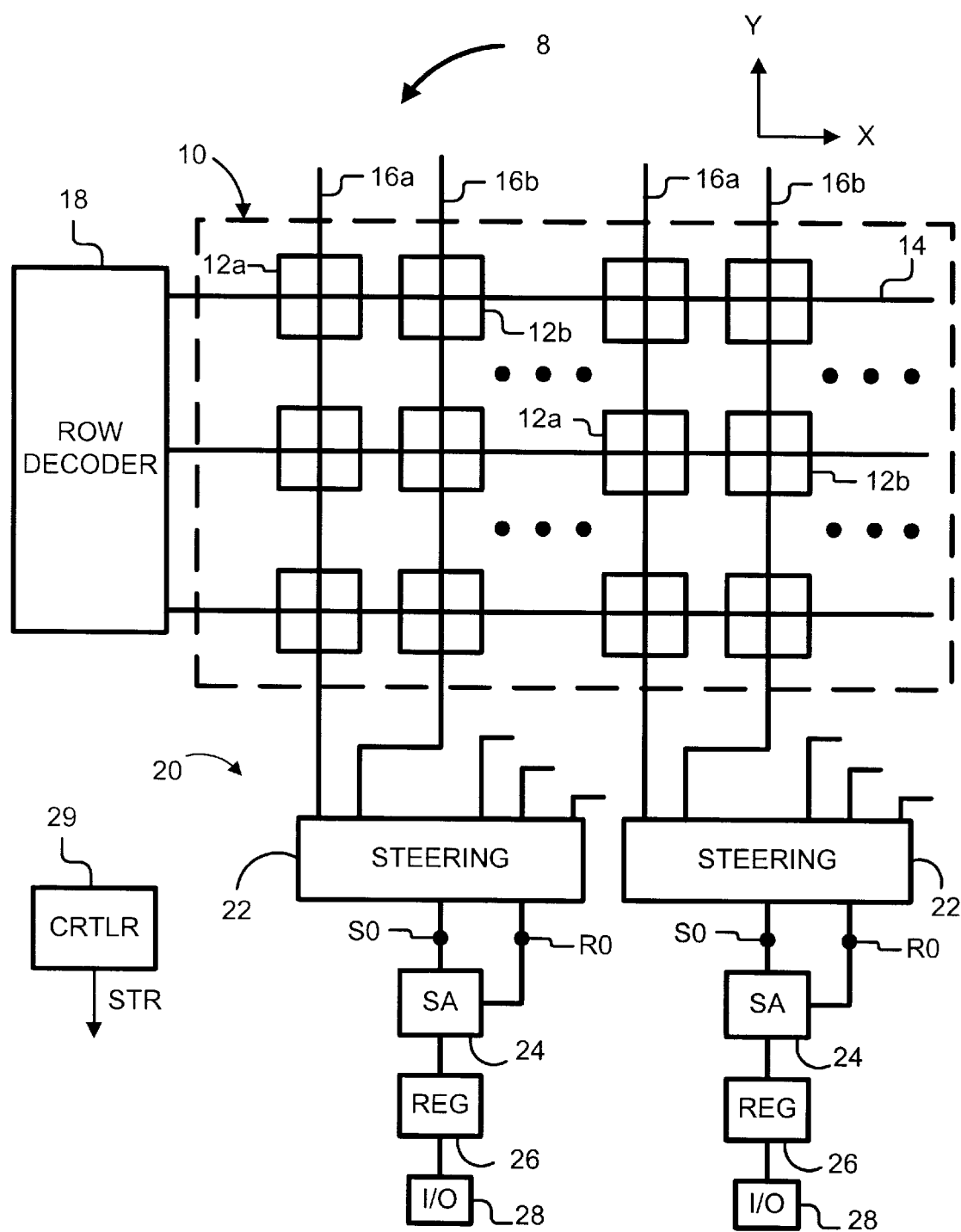
FIG. 1 is an illustration of an information storage device according to the present invention.

As shown in the drawings for purposes of illustration, the present invention is embodied in an information storage device including a resistive cross point memory cell array and read circuits for the array. The read circuits include differential sense amplifiers and direct injection preamplifiers for reliably and quickly sensing different resistance states of selected memory cell elements of the array.

Reference is now made to FIG. 1, which illustrates an information storage device 8 including a resistive cross point array 10 of memory cell elements 12a and 12b. The memory cell elements 12a and 12b are arranged in rows and columns, with the rows extending along an x-direction and the columns extending along a y-direction. Only a relatively small number of memory cell elements 12a and 12b is shown to simplify the illustration of the information storage device 8. In practice, arrays of any size may be used.

Traces functioning as word lines 14 extend along the x-direction in a plane on one side of the memory cell array 10. Traces functioning as bit lines 16a and 16b extend along the y-direction in a plane on an adjacent side of the memory cell array 10. There may be one word line 14 for each row of the array 10 and one bit line 16a or 16b for each column of the array 10. Each memory cell element 12a, 12b is located at a cross point of a word line 14 and a bit line 16a or 16b.

The memory cell elements 12a and 12b may include thin film memory elements such as polymer memory elements, magnetic tunnel junctions (the SDT junction is a type of magnetic tunnel junction), or giant magnetoresistance ("GMR") devices. In general, the memory cells 12 and 12b may include any elements that store or generate information by affecting the magnitude of the nominal resistance of the elements. Such other types of elements include poly-silicon resistors as part of read-only memory, and floating gate transistors as part of optical memory, imaging devices or floating gate memory devices.

Resistance of the SDT junction, for example, is a first value (R) if its magnetization orientation is parallel, and its resistance is increased to a second value (R+ΔR) if its magnetization orientation is changed from parallel to anti-parallel. A typical first resistance value (R) may be about one megaohm and a typical change in resistance (ΔR) may about 30% of the first resistance value (R).

Each memory cell element 12a and 12b retains its orientation of magnetization, even in the absence of external power. Therefore, the memory cell elements 12a and 12b are non-volatile.

Data is stored in the memory cell elements 12a and 12b in a bit-bitbar manner. Two memory cell elements 12a and 12b are assigned to each bit of data: one memory cell element (the "data" element) 12a stores the value of the bit, and the other memory cell element (the "reference" element) 12b stores the complement of the value. Thus, if a data element 12a stores a logic '1', its corresponding reference element 12b stores a logic '0'. Each column of data elements 12a is connected to a bit line 16a and each column of reference elements 12b is connected to a bit line 16b.

The information storage device 8 includes a row decoder 18 for selecting word lines 14 during read and write operations. A selected word line 14 may be connected to ground during a read operation. A write current may be applied to a selected word line 14 during a write operation.

The information storage device 8 includes a read circuit for sensing the resistance states of selected memory cell elements 12a and 12b during read operations and a write circuit for supplying write currents to selected word and bit lines 14, 16a and 16b during write operations. The read circuit is indicated generally at 20. The write circuit is not shown in order to simplify the illustration of the information storage device 8.

The read circuit 20 includes a plurality of steering circuits 22 and sense amplifiers 24. Multiple bit lines 16a and 16b are connected to each steering circuit 22. Each steering circuit 22 includes a decoder for selecting bit lines. A selected memory cell element 12a or 12b lies at the intersection of a selected word line 14 and a selected bit line 16.

During a read operation, the selected elements 12a and 12b are connected to ground by the selected word line 14. Each steering circuit 22 selects a bit line 16a crossing a column of data elements 12a and a bit line 16b crossing the corresponding column of reference elements 12b. The selected bit lines 16a crossing the columns of data elements 12a are connected to sense nodes S0 of their corresponding sense amplifiers 24. The selected bit lines 16b crossing the columns of reference elements 12b are connected to reference nodes R0 of their corresponding sense amplifiers 24. Each sense amplifier 24 includes a differential amplifier and direct injection preamplifiers for comparing signals at the sense and reference nodes S0 and R0. The comparison indicates the resistance state of the selected data element 12a and, therefore, the logic value stored in the selected data element 12a. An output of the sense amplifier 24 is supplied to a data register 26, which, in turn, is coupled to an I/O pad 28 of the information storage device 8.

A subset of all unselected word and bit lines 14, 16a and 16b (e.g., all unselected bit lines 16a and 16b) is connected to a constant voltage source, which provides an array voltage. The constant voltage source may be provided by an external circuit. The sense amplifiers 24 apply the same potential to the selected bit lines 16 as the constant voltage source applies to the subset of unselected lines. Applying such equipotential isolation to the array 10 reduces parasitic currents.

The read circuit 20 may read out data in m-bit words, whereby the resistance states of a number (m) of memory cell elements 12a and 12b are sensed simultaneously. An m-bit word might be read out by operating m consecutive sense amplifiers 24 simultaneously.

Figure 2:
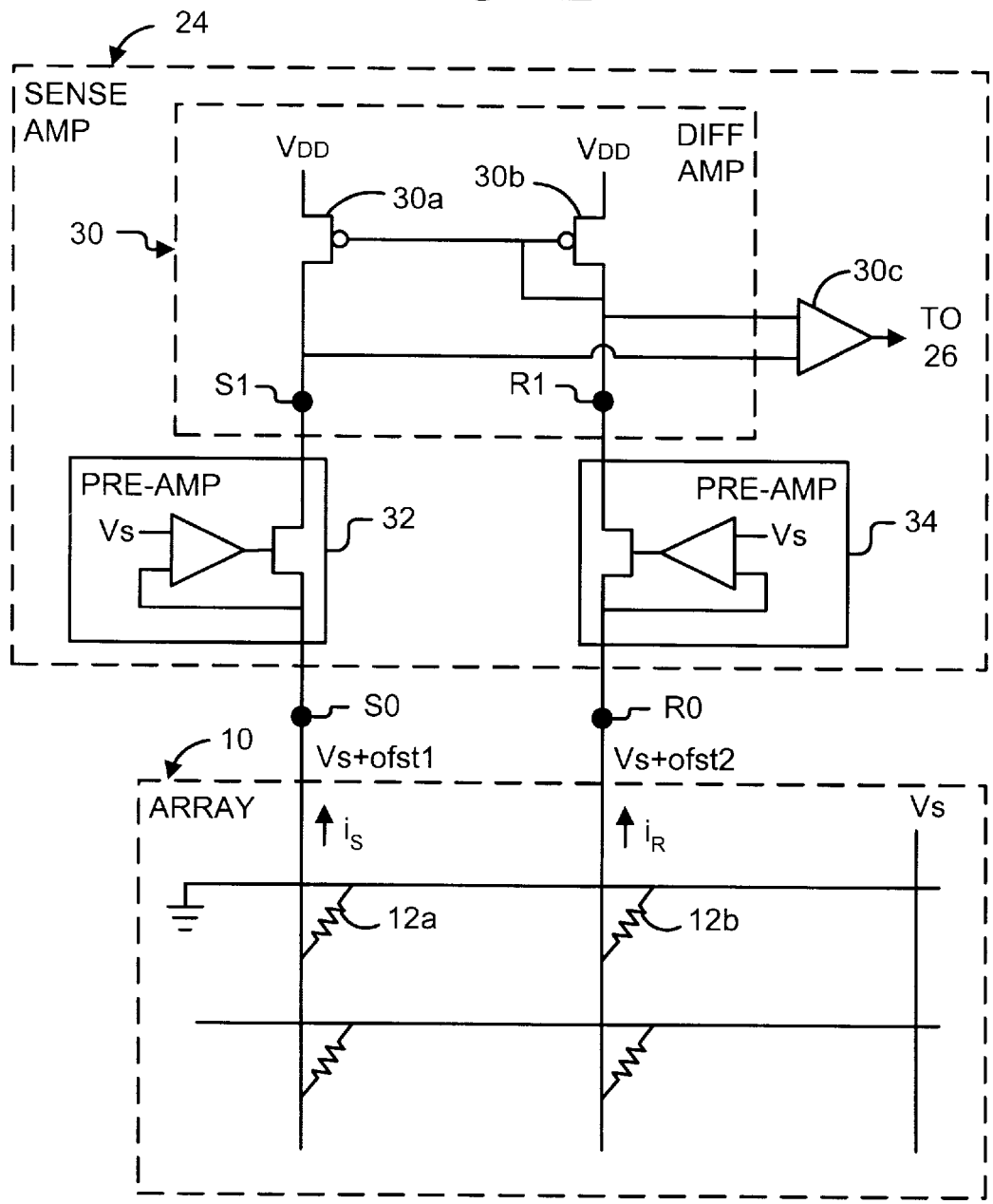
FIG. 2 is an illustration of a differential sense amplifier, which forms a part of a read circuit for the information storage device.

Reference is now made to FIG. 2, which shows a sense amplifier 24 and selected data and reference elements 12a and 12b. The selected data element 12a is represented by a resistor, and the selected reference element 12b is represented by a resistor.

The sense amplifier 24 includes a differential amplifier 30 having a first input node S1 and a second input node R1. The differential sense amplifier 30 may be an analog current mode differential sense amplifier. Such a differential amplifier 30 may include first and second FETS 30a and 30b, which form a mirror circuit. The second FET 30b, which is configured as an p-channel 'diode', functions as a "reference" or "master" transistor. The first FET 30a functions as a "slave" or "mirror" transistor that passes a current directly proportional to the current in the reference transistor 30b. The current in the mirror transistor 30a is referred to as the mirror current.

The differential amplifier 30 amplifies a voltage generated at its first input node S1. The voltage $V_{R1}$ at the second input node R1 is set by the reference current ($i_R$) flowing through the reference transistor 30b. The gate-to-source voltage on the reference transistor 30b is proportional to the current ($i_R$) flowing in the drain of the reference transistor 30b, and the voltage falls into a narrow range near the threshold voltage of reference transistor 30b. The same gate-to-source voltage is applied to the mirror transistor 30a. If the drain voltage (the voltage $V_{S1}$ at the first input node S1) on the mirror transistor 30a is equal to the drain voltage on the reference transistor 30b (the voltage $V_{R1}$ at the second input node R1), the drain current in the mirror transistor 30a will be the same as the drain current in the reference transistor 30b.

The configuration of the mirror transistor 30a presents a high impedance at the first input node S1. When the sense current ($i_S$) is not equal to the reference current ($i_R$), the voltage $V_{S1}$ at the first input node S1 will vary in an attempt to satisfy the "mirror" conditions required by the FETs 30a and 30b of the current mirror circuit. If the sense current ($i_S$) is less than the reference current ($i_R$), the first input node voltage $V_{S1}$ will rise toward the supply voltage $V_{DD}$. If the sense current ($i_S$) is greater than the reference current ($i_R$), the first input node voltage $V_{S1}$ will be pulled down to approximately the array voltage $V_S$. In this manner, the current mirror circuit generates a large voltage difference when the sense current ($i_S$) is not equal to the reference current ($i_R$).

The voltage signal out of the differential amplifier 30 should be large enough to drive a logic gate 30c to a valid digital level, either a '1' or a '0'. This logic gate 30c may be a regenerative circuit that creates a definite logic level. The differential amplifier 30 can amplify a differential voltage across the input nodes S1 and R1 (the difference between $V_{DD}-V_{S1}$ and $V_{DD}-V_{R1}$) to a value greater than a logic '1' threshold when $(V_{DD}-V_{S1})>(V_{DD}-V_{R1})$ and to a value less than a logic '0' threshold when $(V_{DD}-V_{S1})<(V_{DD}-V_{R1})$. No time or integration limits are imposed on the differential amplifier 30 so that the sensing may be performed very quickly. Sending the output of the differential amplifier 30 through the logic gate 30c may be delayed until all circuit transients have settled and the output has settled to its final valid state.

A first (sense) direct injection preamplifier 32 is coupled between the first input node S1 of the differential amplifier 30 and the sense node S0 of the sense amplifier 24. A second (reference) direct injection preamplifier 34 is coupled between the second input node R1 of the differential amplifier 30 and the reference node R1 of the sense amplifier 24. Each direct injection preamplifier 32 and 34 includes a differential amplifier and a transistor operated as a current source. The direct injection preamplifiers 32 and 34 regulate the voltages across the selected elements 12a and 12b.

The direct injection preamplifiers 32 and 34 are preferably calibrated to minimize differences in their offset voltages (ofst1, ofst2). The offset voltages (ofst1, ofst2) should be very close to being equal to each other and they should be near zero. Auto calibrating the preamplifiers 32 and 34 minimizes parasitic currents during read operations and reduces the sensing time. Autocalibrated direct injection preamplifiers are disclosed in U.S. Ser. No. 09/430,238 filed Oct. 29, 1999, now pending which is incorporated herein by reference.

The sensing may be performed in current mode or voltage mode. In current mode, the preamplifiers 32 and 34 regulate the voltages at the sense and reference nodes S0 and R0 to be equal to the array voltage $V_S$. The sense and reference currents ($i_S$ and $i_R$), which are created by the voltage drop across the selected elements 12a and 12b, flow to the input nodes S1, R1 of the differential amplifier 30. The differential amplifier 30 measures the static response of the mirror and reference transistors 30a and 30b to the sense and reference currents ($i_S$ and $i_R$). The comparator 30c generates a signal indicating the input node S1 or R1 that receives the higher current.

In voltage mode, the sense current ($i_S$) is converted to a voltage (e.g., by integrating the sense current over a period of time). The sense amplifier 24 senses the level of the integrated voltage as a differential voltage across the input nodes S1 and R1.

The output of the comparator 30c is not strobed immediately into the data register 26. Transients are usually created when a word line 14 goes from an unselected-to-selected state and a previously selected word line 14 goes from a selected-to-unselected state. Transients are also usually created when the bit line 16 goes from an unselected-to-selected state and a previously selected bit line 16 goes from a selected-to-unselected state. Switching between read and write modes can also cause transients. These transients propagate through the preamplifiers 32 and 34 and the differential amplifier 30. These transients are allowed to settle over a time interval. This time interval is determined empirically and through knowledge of the technology. The time interval may be based on the sense and reference currents ($i_S$ and $i_R$) and the capacitances at the input nodes S1 and R1 of the differential amplifier 30.

Once a reliable signal on the output of the comparator 30c has developed, the output of the comparator 30c is strobed into the data register 26. An on-chip controller 29 (see FIG. 1) may be provided to generate a signal STR for causing the output of the comparator 30c to be strobed into the data register 26. The strobe signal STR could be as simple as a delayed pulse generated by the last address or write/read command.

Reference is now made to FIG. 3, which shows a method of reading a data element. A calibration address is selected (block 102), and the preamplifiers are autocalibrated (block 104). An address may be selected near the center of the array. The value of the data stored in the memory cell element selected for the autocalibration process is not important; the calibration circuit uses the current in the selected memory cell element to get "close" to the average sense currents. A shorted or open memory cell element should not be at the address selected for autocalibration. Actual selection of the autocalibration address may be arbitrary with the provision that the selected element is not an open or short.

The addresses of the data and reference elements 12a and 12b are decoded to select the word and bit lines 14, 16a and 16b connected to the selected data and reference elements 12a and 12b (block 106). The sense amplifier 24 senses the signals at the sense and reference nodes S1 and R1 while applying equipotential isolation (block 108). Once a reliable signal has developed on the output of the sense amplifier 24, the output is strobed into the data register 26 (block 110).

Although FIG. 1 shows a bit-bitbar arrangement for the memory cell elements 12a and 12b, the information storage device is not so-limited. Any number of columns may be used as the reference columns and in any location. As an example, one column (e.g., the last column) may be used as a reference column, whereby the bit line connected to the last column is connected to the second preamplifier of each sense amplifier. The reference cells may have resistance values equal to half the resistance value expected for a data '0' and a data '1' (that is, $R+\Delta R/2$). However, the reference cells 26 are not limited to such a resistance value.

Reference is now made to FIG. 4, which illustrates a chip 200 having multiple levels or planes 202 of resistive cross point memory cell arrays. The planes 202 are stacked on a substrate 204 and separated by insulating material (not shown) such as silicon dioxide. Read and write circuits may be fabricated on the substrate 204. The read and write circuits may include additional multiplexers for selecting the levels that are read from and written to.

The information storage device according to the present invention may be used in a wide variety of applications. For example, the information storage device may be used for long-term data storage in a computer. Such a device offers many advantages over conventional long-term data storage devices such as hard drives. Accessing data is orders of magnitude faster than accessing data from hard drives. In addition, the information storage device according to the present invention is more compact than hard drives.

The information storage device according to the present invention may be used in digital cameras for long-term storage of digital images. If the calibration is accurate and the preamplifier offsets can be equalized, the information storage device may even replace DRAM and other fast, short-term memory in computers.

The present invention is not limited to the specific embodiments described and illustrated above. Instead, the present invention is construed according to the claims that follow.

What is claimed is:

1. A read circuit for an information storage device, the information storage device including a resistive cross point memory cell array, the circuit comprising:
   a differential amplifier having first and second input nodes;
   a first direct injection preamplifier coupled to the first input node of the differential amplifier; and
   a second direct injection preamplifier coupled to the second input node of the differential amplifier.

2. The circuit of claim 1, wherein the first and second preamplifiers are autocalibration types.

3. The circuit of claim 1, wherein the differential amplifier is a current mode differential amplifier.

4. The circuit of claim 3, wherein the differential amplifier includes a current mirror circuit, the current mirror circuit including a mirror transistor coupled to the first input node and a reference transistor coupled to the second input node; and wherein the read circuit further comprises a comparator for comparing signals at the input nodes of the differential amplifier.

5. The circuit of claim 4, wherein during a read operation the comparator compares a current flowing through a selected memory cell element to a current flowing through a reference element.

6. The circuit of claim 4, wherein during a read operation the comparator compares a voltage at the first input node to a voltage at the second input node.

7. The circuit of claim 1, further comprising means for coupling the first preamplifier between the first input node and a selected memory cell element during read operations and for coupling the second preamplifier between the second input node and a reference memory cell element during read operations.

8. The circuit of claim 1, further comprising means for applying equipotential isolation to the array during read operations.

9. An information storage device comprising:

a resistive cross point array of memory cell elements; and a read circuit including a plurality of differential amplifiers, a plurality of first direct injection preamplifiers, and a plurality of second direct injection preamplifiers;

at least one of the first preamplifiers being coupled between a first memory cell element of the array and a first differential amplifier input node during a read operation;

at least one of the second preamplifiers being coupled between a second memory cell element of the array and a second differential amplifier input node during the read operation.

10. The device of claim 9, further comprising a plurality of traces crossing the memory cell elements, wherein a potential is applied to the trace connected to the selected memory cell element; and wherein an equal potential is applied to a subset of traces connected to unselected memory cell elements.

11. The device of claim 9, wherein data is stored in the memory cell elements in a bar-bitbar manner.

12. The device of claim 9, wherein the first and second preamplifiers are autocalibration types.

13. The device of claim 9, wherein the differential amplifiers are current mode differential amplifiers.

14. The device of claim 9, wherein during said read operation each differential amplifier amplifies a difference in currents flowing through a selected memory cell element and a reference element.

15. The device of claim 9, wherein during said read operation each differential amplifier amplifies a difference in voltage at its input nodes.

16. A method of using a differential amplifier, first and second direct injection preamplifiers, and a reference element to sense a resistance state of a memory cell element in a resistive cross point memory cell array, the differential amplifier having first and second input nodes, the method comprising:

coupling the first direct injection preamplifier between the memory cell element and the first input node of the differential amplifier;

coupling the second direct injection preamplifier between the reference element and the second input node of the differential amplifier; and comparing signals at the inputs nodes of the differential amplifier.

17. The method of claim 16, further comprising waiting a time interval before storing results of the comparison.

18. The method of claim 16, further comprising applying equipotential isolation to the array while comparing the signals at the input nodes.

19. The method of claim 16, wherein the sensing is performed in current mode.

20. The method of claim 16, wherein the sensing is performed in voltage mode.

21. The method of claim 16, further comprising autocalibrating the preamplifiers.

22. The method of claim 16, further comprising storing a data value in the memory cell element and a complement of the data value in the reference element.

* * * * *